(12) United States Patent
Denier et al.

(10) Patent No.: US 7,944,270 B2
(45) Date of Patent: May 17, 2011

(54) ARRANGEMENT AND METHOD FOR TEMPERATURE COMPENSATION FOR RESISTANCE

(75) Inventors: Urs Denier, Rapperswil (CH); Vivek Sharma, Olten (CH)

(73) Assignee: austriamicrosystems AG, Unterpremstätten (AT)

( * ) Notice: Subject to any disclaimer, the term of this patent is extended or adjusted under 35 U.S.C. 154(b) by 350 days.

(21) Appl. No.: 11/918,583

(22) PCT Filed: Apr. 7, 2006

(86) PCT No.: PCT/EP2006/003206
§ 371 (c)(1),
(2), (4) Date: Feb. 4, 2009

(87) PCT Pub. No.: WO2006/108575
PCT Pub. Date: Oct. 19, 2006

(65) Prior Publication Data
US 2009/0219129 A1   Sep. 3, 2009

(30) Foreign Application Priority Data

Apr. 15, 2005  (DE) .................. 10 2005 017 538

(51) Int. Cl.
*H01L 35/00* (2006.01)
*H01L 37/00* (2006.01)
*H03K 3/42* (2006.01)
*H03K 17/78* (2006.01)

(52) U.S. Cl. ...................................... 327/513
(58) Field of Classification Search ............ 327/513
See application file for complete search history.

(56) References Cited

U.S. PATENT DOCUMENTS

| 3,231,827 | A | * | 1/1966 | Legler .................. 330/263 |
| 4,781,195 | A |   | 11/1988 | Martin |
| 5,124,593 | A | * | 6/1992 | Michel .................. 327/554 |
| 5,912,589 | A |   | 6/1999 | Khoury et al. |
| 5,973,524 | A |   | 10/1999 | Martin |
| 6,646,539 | B2 |  | 11/2003 | Bloch |

FOREIGN PATENT DOCUMENTS

| DE | 69626912 T2 | 10/2003 |
| EP | 0477694 A   | 4/1992  |
| EP | 0766385 A2  | 4/1997  |

OTHER PUBLICATIONS

J.P. Hein, et al., "z-Domain Model for Discret-Time PLL's", IEEE Trans. Circuits and Systems, vol. 35, Nov. 1988, pp. 1393-1400.
D.A. Johns, et al., "Analog Integrated Circuit Design", Toronto, Canada, Wiley 1997, Chapter 5, pp. 248-250.

(Continued)

*Primary Examiner* — Lincoln Donovan
*Assistant Examiner* — Daniel Rojas
(74) *Attorney, Agent, or Firm* — Cohen Pontani Lieberman & Pavane LLP

(57) ABSTRACT

An arrangement and a method for temperature compensation for a resistance (1). A resistance (1) with a controllable resistance value is compared with a reference resistance (2) which is in the form of a switched capacitor. A comparator (3) compares the two resistance values with one another. The comparator (3) takes an error signal as a basis for actuating the controllable resistance (1). This produces a thermally stable resistance. The principle can preferably be applied in transimpedance amplifiers.

16 Claims, 6 Drawing Sheets

OTHER PUBLICATIONS

K.N. Leung, et al., "A Sub-1-V 15-ppm/° C. CMOS Bandgap Voltage Reference without Requiring Low Threshold Voltage Device", IEEE Journal of Solid-State Circuits, vol. 37, No. 4, Apr. 2002, pp. 526-530.

A. Maclaren, et al., "Generation of Accurate On-Chip Time Constants and Stable Transductances", IEEE Journal of Solid-State Circuits, vol. 36, No. 4, Apr. 2001, pp. 691-695.

D.M. Pietruszynski, et al., "A 50-Mbit/s CMOS Monolithic Optical Receiver", IEEE Journal of Solid-State Circuits, vol. 23, No. 6, Dec. 1988, pp. 1426-1433.

Vanalog, "Tuning Fiork Quartz Crystal", Datasheet WX26B, 2006.

* cited by examiner

US 7,944,270 B2

ARRANGEMENT AND METHOD FOR TEMPERATURE COMPENSATION FOR RESISTANCE

RELATED APPLICATIONS

This is a U.S. national stage of International Application No. PCT/EP2006/03206, filed on Apr. 7, 2006.

This patent application claims the priority of German patent application No. 10 2005 017 538.4 filed Apr. 15, 2005, the disclosure content of which is hereby incorporated by reference.

FIELD OF THE INVENTION

The present invention relates to an arrangement for temperature compensation for a resistance and to a method for temperature compensation for a resistance.

BACKGROUND OF THE INVENTION

Integrated resistances in semiconductor circuitry normally have a relatively high level of temperature dependency. However, it may be desirable to provide an integrated resistance in temperature-independent or temperature-compensated fashion. Such resistances which are insensitive to temperature are used, inter alia, in high-accuracy transconductance amplifiers, high-accuracy transimpedance amplifiers and in applications in medical engineering, for example in measuring equipment for blood sugar content.

Pages 248 to 250 in chapter 5.2 of the document by D. A. Johns, K. Martin: "Analog Integrated Circuit Design", Toronto, Ontario, Canada, Wiley 1997 indicate how to provide on-chip resistances in thermally stable fashion. In this document, the transconductance of an operational amplifier is stabilized by virtue of there being a high-accuracy, thermally stable external resistance in the form of a non-integrated, discrete component.

The document by A. McLaren and K. Martin: "Generation of Accurate On-Chip Time Constants And Stable Transconductances", IEEE Journal of Solid-State Circuits, Vol. 36, No. 4, April 2001 proposes a development of this principle such that an on-chip resistance is used instead of the external reference resistance. For the purpose of calibrating this resistance, complex analog circuitry is provided and also there is a need for a variable bias resistance split into numerous, parallel-connected elemental resistances, graduated in binary and thermometer code, see FIG. 5 therein.

With a temperature variation of around 60° Celsius, the transconductance scatter for this principle is nevertheless around 2.2%. Added to this is the fact that the convergence for such a circuit is relatively slow.

SUMMARY OF THE INVENTION

It is an object of the present invention to provide an arrangement and a method for temperature compensation for a resistance which are able to be implemented using integrated circuitry, have reduced circuit complexity and allow precise calibration.

This and other objects are attained in accordance with one aspect of the present invention directed to an arrangement for temperature compensation for a resistance:
having a resistance with a controllable resistance value,
having a reference resistance which is in the form of a switched capacitor,
having a comparator whose input side is coupled to the controllable resistance and to the reference resistance and which has an output for outputting an error signal, and
having a control input on the controllable resistance which is coupled to the output of the comparator for the purpose of controlling the resistance value.

Another aspect of the present invention is directed to a method for temperature compensation for a resistance having the following method steps:
provision of a controllable resistance,
provision and actuation of a reference resistance as a switched capacitor,
comparison of the resistance value of the controllable resistance with the resistance value of the reference resistance,
control of the resistance value of the controllable resistance on the basis of a comparison result from the comparison.

The reference resistance can be provided by virtue of a switched capacitor forming the resistance being provided. The temperature compensation for a resistance is achieved by virtue of the resistance being controlled on the basis of a comparison result between the resistance value of the controllable resistance and the reference resistance, which the switched capacitor has as equivalent resistance value.

The switched-capacitor reference resistance is preferably of integrated design and has a temperature independency in practice. The temperature dependency of a switched capacitor is less than 100 ppm per Kelvin.

The controllable resistance can comprise a series circuit. The series circuit preferably has a fixed-value resistance and the controllable resistance.

The fixed-value resistance is preferably in the form of an integrated polyresistance. The controllable resistance is preferably in the form of a metal oxide semiconductor, MOS, transistor, with the resistance used being the controlled path and the control input used being the gate connection of the transistor.

In this case, the total resistance of the series circuit is kept constant in temperature-independent fashion by virtue of the total resistance of the series circuit being compared with the reference resistance, and the controllable resistance being controlled on the basis of any discrepancy, on the basis of the comparison result.

The controllable resistance can be controlled in a control loop such that the total resistance of the series circuit remains constant.

The reference resistance in the form of a switched capacitor preferably comprises a capacitance and at least one switch for periodic changeover. Such switched capacitors are also called switched capacitances.

In the case of a switched capacitance, the reference resistance is simulated by the switched capacitor. If a changeover switch connects the switched capacitance $C_S$ to an input voltage U then the capacitor receives a charge quantity Q which corresponds to the product of the capacitance value and the input voltage. In the other switch position, the capacitor outputs the same charge again. It therefore transfers this charge from the input to the output of the circuit in each switching period $T_S$. This produces a flow of current I which, on average, sets itself to $$I = C_s \cdot \frac{U}{T_s} = C_s \cdot U \cdot f_s.$$

The basic equivalence between the switched capacitance and a nonreactive resistance can therefore be indicated as $$R = \frac{1}{C_s \cdot f_s},$$

where R is the equivalent resistance. Notable is the linear relationship between the switching frequency $f_s$ and the equivalent admittance.

The capacitor in the switched-capacitor reference resistance may be in the form of what is known as a poly-poly or metal-metal structure, for example.

Consequently, the value of the reference resistance of a switched capacitor is dependent only on the switching frequency and the capacitance value. The temperature coefficient of the capacitance value is relatively low and is approximately 30 ppm per Kelvin, for example.

The practical implementation of such a circuit is relatively simple. It provides a quick and stable result, and requires only a few components to implement it. In addition, it affords a high level of flexibility in the choice of calibration parameters, which can be valuable for cost-efficient implementation.

The reference clock for actuating the reference resistance in the form of a switched capacitor is preferably provided by a reference clock generator. The reference clock generator preferably actuates the switch for periodic changeover.

In one embodiment of the invention, the controllable resistance is arranged in the return path of an amplifier. This means that it is possible to provide not only a resistance having high temperature constancy but also an amplifier having temperature-independent transconductance or transimpedance.

When the controllable resistance is in the form of a series circuit, the fixed-value resistance is preferably in the form of a polysilicon resistance in integrated form. The controllable resistance in this series circuit is a tunable metal oxide semiconductor, MOS, transistor which is preferably operated in the linear range.

In one embodiment of the invention, a common current source is provided which can be switchably connected either to a first or to a second current path. The first current path comprises the controllable resistance. The second current path comprises the reference resistance, which is in the form of a switched capacitor. The comparator has a respective input coupled to the first and to the second current path. Hence, both current paths carry a current of the same magnitude, which results in even higher precision for the temperature compensation for the controllable resistance.

As a further preference, the temperature compensation is produced by using a calibration current signal on the basis of the chopping principle. This chopping calibration signal can be produced using a small current source and a switch, for example. In this case, the clock rate is chosen such that the calibration signal's frequency is at a sufficient distance from the useful frequency range of a useful signal for processing. In this case, the controllable resistance is preferably arranged in a useful signal path. The useful signal path is set up for signal processing for a useful signal in a useful frequency range. The useful frequency range is different than the frequency of the reference clock. The chopped calibration signal is accordingly superimposed on the useful signal.

If, as envisaged as a preference, a current source is provided jointly for both current paths then process and temperature fluctuations cannot influence the performance of the temperature compensation, since the same current flows both through the controllable resistance and through the reference resistance.

The level of the calibration current on the basis of the reference clock is preferably low in order to avoid limiting the dynamic range of the useful signal path.

Preferably, the output signals from both current paths are demodulated with respect to the chopping signal and, after suitable filtering, are compared with one another. The filtering is preferably suitable for removing the useful signal, which has now been converted to the chopping frequency. In this case, the comparator is preferably a single-stage amplifier the output of which can be used to control the controllable resistance. This ensures that the resistance value of the controllable resistance follows the reference resistance accurately.

A calibration signal, which the useful signal contains on account of the chopping, outside of the useful frequency range with low amplitude can easily be removed. This can be done using analog filters or digital filters, for example. Digital filters can be used advantageously particularly when the useful signal is being digitized anyway for subsequent further processing.

In another embodiment of the invention, in addition to the controllable resistance a further controllable resistance having a controllable resistance value is provided and is arranged in a useful signal path. Accordingly the further controllable resistance with a controllable resistance value is used for the actual useful signal processing, while the controllable resistance to be compared with the reference resistance is formed in an auxiliary path. This controllable resistance can also be understood to be a dummy component. This dispenses with the useful signal being superimposed with a chopping signal. This dummy resistance is used to produce an output current which is compared with an equivalent reference current. The equivalent reference current is produced in a switched-capacitor resistance. The two currents are compared using an error amplifier. The error amplifier produces a control signal which is used to control the controllable resistance and the further controllable resistance. This control signal is used to alter the controllable resistance value until the two currents being compared by the comparator are the same. Preferably, the control signal is carried by a loop filter which guarantees the stability of the control loop. A temperature drift which nevertheless remains is dependent on the accuracy of a reference voltage, on the temperature drift in the capacitive reference element in the switched-capacitor reference resistance, on a temperature drift in a clock source and on a temperature drift in a preferably provided current mirror. To produce a stable reference voltage, a bandgap generator arrangement may be provided, for example. Such bandgaps have a temperature coefficient of less than 15 ppm per Kelvin, for example. Crystal clock generators have excellent, low temperature coefficients of very much lower than 1 ppm per Kelvin, for example. Accordingly, the reference capacitor in the switched-capacitor reference resistance makes the primary contribution to the temperature drift which still remains, for example at 43 ppm per Kelvin. Even with worst-case appraisal of all of these causes of a temperature drift, the latter remains significantly below 100 ppm per Kelvin overall, which is a significant improvement, with particularly simple circuit implementation in addition. The use of a copy of the controllable resistance as proposed in this development means that any errors which might arise as a result of charge injections from the switched-capacitor circuit into the useful signal path are avoided.

In this development too, the controllable resistance is preferably formed in a series circuit comprising a fixed-value resistance and the controllable resistance.

As a further preference, the error amplifier, namely the comparator, is designed using switched-capacitor technology.

A loop filter for filtering the control signal which is output by the comparator is also preferably designed using switched-capacitor technology.

BRIEF DESCRIPTION OF THE DRAWINGS

The invention is explained in more detail below using a plurality of exemplary embodiments with reference to drawings, in which.

DETAILED DESCRIPTION OF THE DRAWINGS

Figure 1:
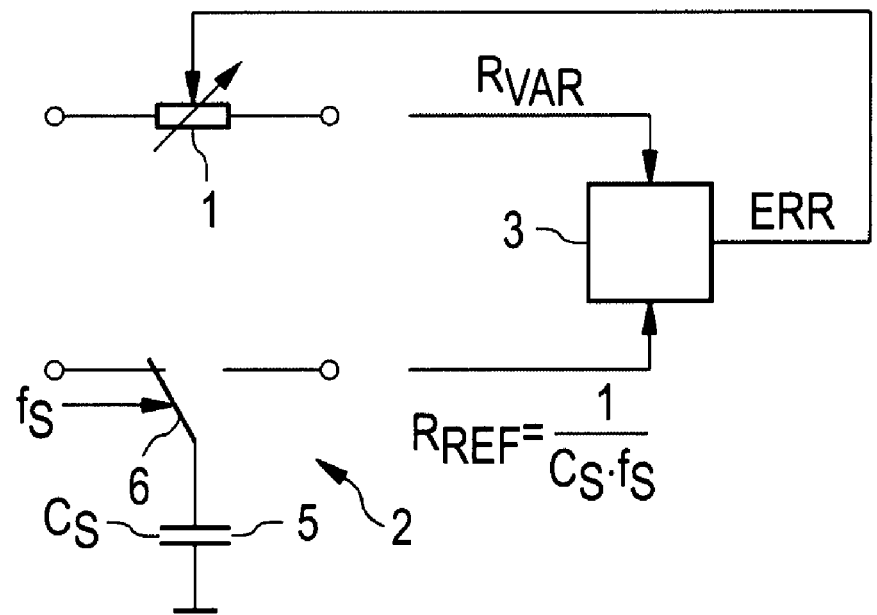
FIG. 1 shows a first exemplary embodiment of an arrangement in accordance with the invention.

FIG. 1 shows an exemplary arrangement for temperature compensation for a resistance in accordance with the invention. A resistance 1 with a controllable resistance value is provided. In addition, the arrangement comprises a reference resistance 2 which is in the form of a switched capacitor. A comparator 3 has two inputs. A first input is coupled to the controllable resistance 1 for the purpose of transmitting the resistance value of the controllable resistance 1 or a signal derived therefrom. The second input of the comparator 3 is coupled to the reference resistance 2 for the purpose of transmitting the reference resistance value or a value derived therefrom. An output of the comparator is designed to output an error signal. The error signal is dependent on a discrepancy between the resistance value of the controllable resistance and the resistance value of the reference resistance. The output of the comparator 3 is connected to a control input of the controllable resistance 1.

FIG. 1 shows an exemplary arrangement for temperature compensation for a resistance in accordance with the invention. A resistance 1 with a controllable resistance value is provided. In addition, the arrangement comprises a reference resistance 2 which is in the form of a switched capacitor. A comparator 3 has two inputs. A first input is coupled to the controllable resistance 1 for the purpose of transmitting the resistance value of the controllable resistance 1 or a signal derived therefrom. The second input of the comparator 3 is coupled to the reference resistance 2 for the purpose of transmitting the reference resistance value or a value derived therefrom. An output of the comparator is designed to output an error signal. The error signal is dependent on a discrepancy between the resistance value of the controllable resistance and the resistance value of the reference resistance. The output of the comparator 3 is connected to a control input of the controllable resistance 1.

The reference resistance 2 in the form of a switched capacitor comprises a reference capacitor 5 and a switch 6. The switch 6 is actuated at a clock frequency $f_S$ of a reference clock. The equivalent resistance of this switched-capacitor reference resistance is calculated, on the basis of the specification, from the reciprocal product of the capacitance value $C_S$ of the capacitor 5 and the clock frequency $f_S$ of the reference clock actuating the switch 6.

The comparator compares the resistance value of the controllable resistance with the resistance value of the reference resistance. As soon as a temperature-related discrepancy in the resistance value of the controllable resistance 1 is found, the comparator outputs an error signal such that the resistance value of the controllable resistance 1 is tracked to the resistance value of the thermally stable reference resistance.

This achieves highly precise temperature compensation for the controllable resistance 1. Temperature dependencies in the resistance value of the controllable resistance 1 are corrected practically completely.

Figure 2:
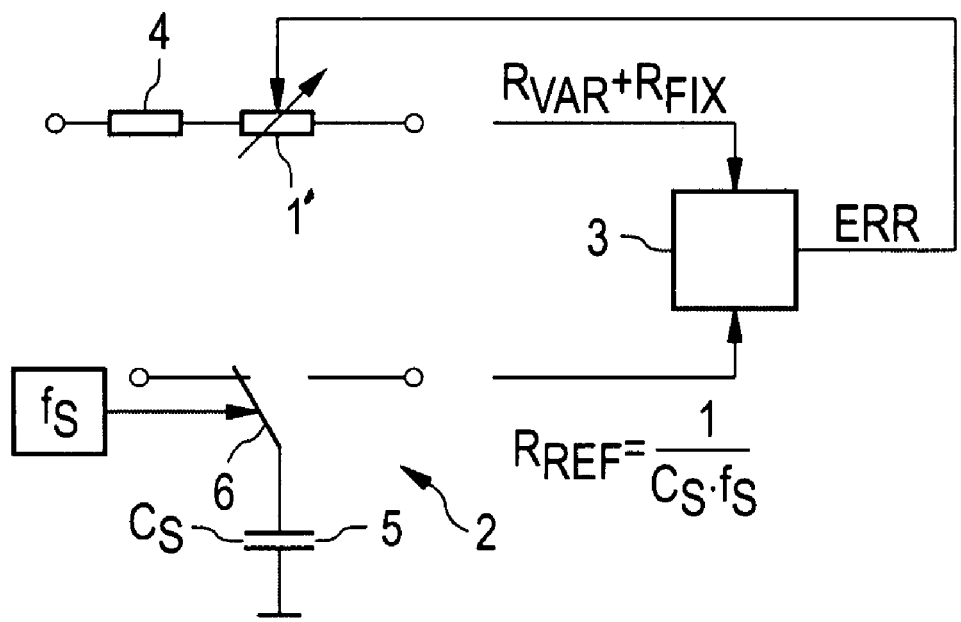
FIG. 2 shows a second exemplary embodiment of an arrangement in accordance with the invention.

FIG. 2 shows a development of the circuit from FIG. 1, these figures largely matching in terms of the components used, the way in which they work and the advantages achieved thereby. Instead of the controllable resistance 1 from FIG. 1, FIG. 2 has a series circuit which comprises a fixed-value resistance 4 and a controllable resistance 1'. In the case of the circuit in FIG. 2, the resistance value of the series circuit comprising the fixed-value resistance 4 and the controllable resistance 1' is compared with the reference resistance 2. The fixed-value resistance 4 may be in the form of a polysilicon resistance, for example, and may therefore have a relatively high level of temperature dependency, which is compensated for using the controllable resistance 1' and the described control loop. Hence, the sum of the resistance value of the fixed-value resistance 4 and the controllable resistance 1' is always kept constant, even in the event of severe changes in the ambient temperature.

Figure 3:
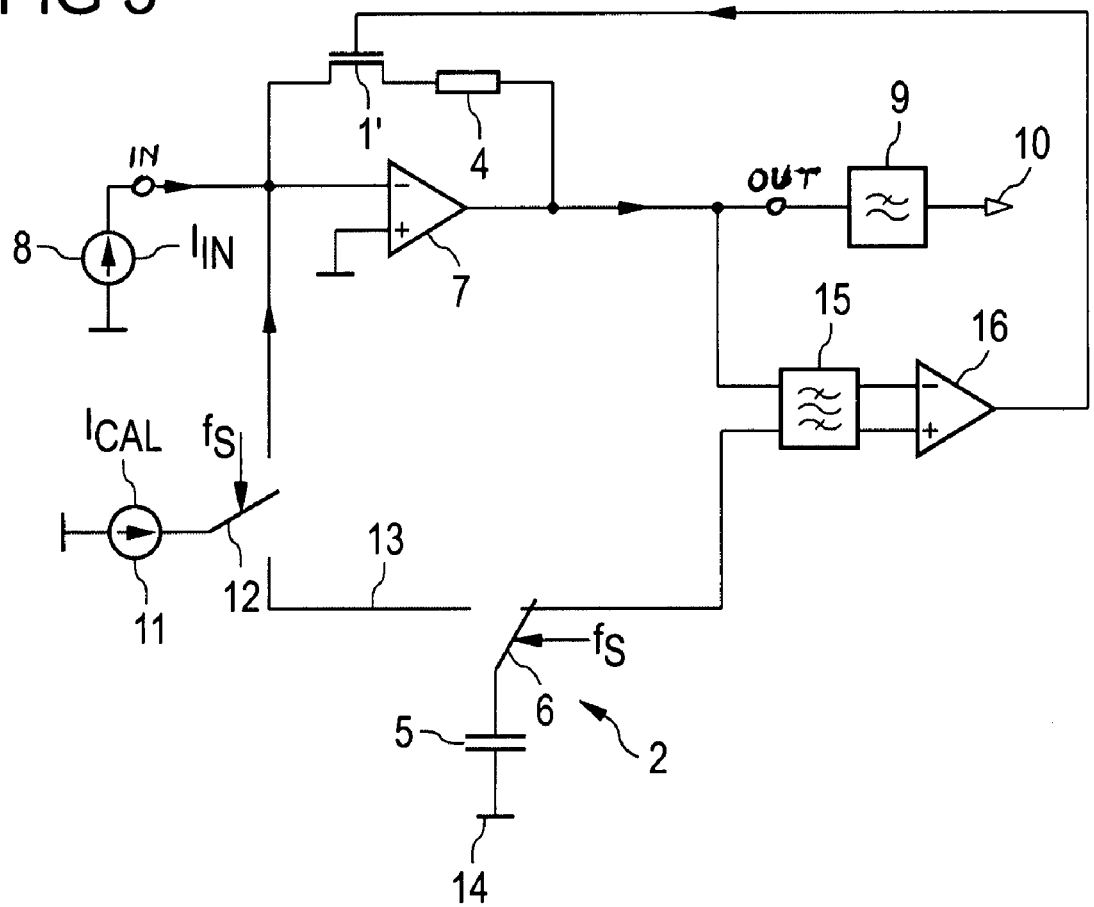
FIG. 3 shows an exemplary development of the circuit from FIG. 2 with a chopping principle.

FIG. 3 shows a development of the circuit from FIG. 2 on the basis of a chopping principle. In this case, a calibration signal is superimposed on a useful signal for processing. Specifically, in the present exemplary embodiment the series circuit comprising the fixed-value resistance 4 and the controllable resistance 1' is connected between an output of an operational amplifier 7 and an inverting input of the operational amplifier 7. The operational amplifier 7 is in the form of a transimpedance amplifier. The controllable resistance 1' is in the form of a metal oxide semiconductor, MOS, transistor. The operational amplifier 7 is arranged in a useful signal path, with its inverting input additionally having a useful signal source 8 connected to it. The useful signal source outputs an input current $I_{IN}$. The output of the operational amplifier 7 is connected to an output 10 of the useful signal path via a low pass filter 9.

A common current source 11 is switchably connected either to the inverting input of the operational amplifier 7 or to a second current path 13 by means of a changeover switch 12. In this case, the common current source 11 outputs a calibration current $I_{CAL}$. The non-inverting input of the operational amplifier 7 is connected to a reference potential connection. The second current path 13 comprises a reference resistance in the form of a switched capacitor 2, which in turn comprises a capacitance 5 and a changeover switch 6. The free connection of the capacitance is connected to a reference potential connection 14. Both the changeover switch 12 for the common current source 11 and the changeover switch 6 for the switched-capacitor reference resistance 2 are controlled by a reference clock at the reference frequency $f_S$. The output of the operational amplifier 7 is connected to an input of a comparator 16 via a bandpass filter 15 to form a first current path. Similarly, the second current path 13, which comprises the reference resistance 2, is connected to a second input of the comparator 16 via the bandpass filter 15. The output of the comparator 16 is connected to the gate connection of the controllable resistance 1' in the form of a transistor, to form a control loop.

Temperature fluctuations in the fixed-value resistance 4 in the form of an integrated polyresistance are automatically compensated for by using a calibration. The MOS transistor 1' is operated in its linear range. The total resistance of this series circuit 4, 1' is compared with the reference resistance 2, the equivalent resistance of the switched capacitor 5.

The reference capacitor 5 is in the form of a poly-poly or metal-metal structure. The equivalent reference resistance of the reference resistance 2 is dependent only on the switching frequency $f_S$ and the capacitance value of the capacitor 5, whose temperature coefficient is relatively low, for example approximately 30 ppm per Kelvin.

A small calibration current is produced by means of the calibration current source 11 using commutation. This calibration current is used to measure the resistance 4, 1' and also the reference resistance 2 and to compare them. To this end, periodic changeover at the switching frequency $f_S$ is provided. A filtering unit 15 and a comparison unit 16 are used to produce a control signal which controls the gate-source voltage of the MOS transistor 1' and hence changes the resistance of the latter's controlled path.

The practical implementation is very simple and the calibration can take place continuously in the background without interrupting the useful signal processing between the generator 8 and the output 10 of the useful signal path. This works very quickly and requires only a few components. Furthermore, a high level of flexibility is provided.

In the present case, the calibration is accordingly performed using a chopped calibration current signal. This chopping signal is easily produced with the calibration current source 11 and the switch 12. The clock rate $f_s$ for the switch 12 is chosen such that the frequency of the calibration signal is sufficiently separated from the useful frequency range, supplied by the useful signal source 8, the transimpedance amplifier 7 operating in this useful frequency range. The expression "sufficiently separated" refers to a magnitude such as to enable removal of the calibration frequency from the useful signal. Process and temperature fluctuations in the calibration current from the source 11 have no influence on the properties and quality of the calibration operation, since the same calibration current $I_{CAL}$ flows both through the reference resistance in the second current path 13 and through the first current path, which comprises the fixed-value resistance 4 and the controlled resistance 1'. The magnitude of the calibration current may be small in order to avoid limiting the dynamic range of the useful signal processing.

The bandpass filter 15 comprises means for demodulating the chopping signal using a simple chopper and downstream filtering. The filtering is used to eliminate the useful signal, which has now been converted to the chopping frequency.

The comparison in the comparator 16 can be performed using a simple single-stage amplifier whose output is used to tune the resistance 1'. This ensures that the target resistance 1', 4 follows the reference resistance 2 as a series circuit.

In relation to the useful signal at the output of the amplifier 7, the calibration signal is small and is outside of the useful frequency range, it can easily be removed using the low pass filter 9. Even more simple is the removal of the calibration components in the useful signal in the digital domain after analog/digital conversion.

In the present case, the calibrating principle is shown by means of a transimpedance amplifier 7. It goes without saying that the principle can also be applied, within the context of the invention, to other circuit configurations with modifications which are within the scope of technical action. By way of example, the calibration signal may be a voltage or a current, and the type of comparison and of calibration may be current comparison, voltage comparison or similar. The level and frequency of the calibration signal may accordingly match the application. In this case, it is desirable to keep the frequency of the calibration signal sufficiently separated from the useful signal frequency band, be it at a higher or at a lower frequency. In this way it is possible to use a very small calibration signal in terms of its amplitude. A simplified filter design is possible. The filters may be RC, $G_mC$ or SC filters.

Figure 4A:
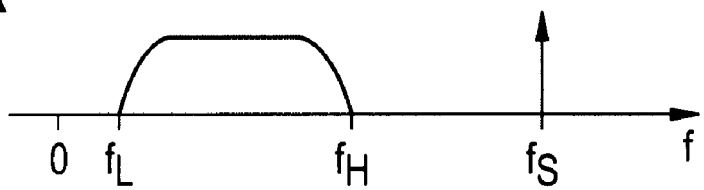
FIGS. 4a and 4b show the relationship between clock frequency and useful frequency range for the circuit from FIG. 3.

FIG. 4a shows the frequency band for the useful signal between the lower and upper frequencies $f_L$, $f_H$ by way of example. It can be seen that the clock frequency $f_s$ of the calibration signal is sufficiently separated from the useful signal band for the filter operations described.

Figure 4B:
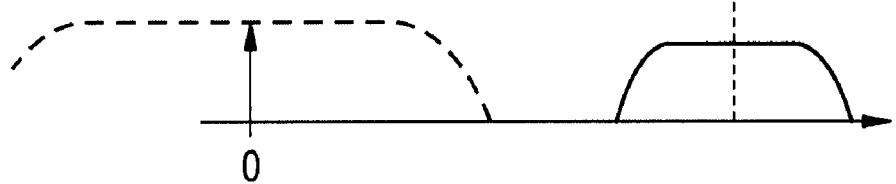

FIG. 4b shows the same signal spectrum as FIG. 4a, but after chopping. In this case, the chopping frequency is precisely the clock frequency $f_S$. The dashed line corresponds to the filter characteristic. The useful signal band has been modulated onto the chopping frequency.

Figure 5:
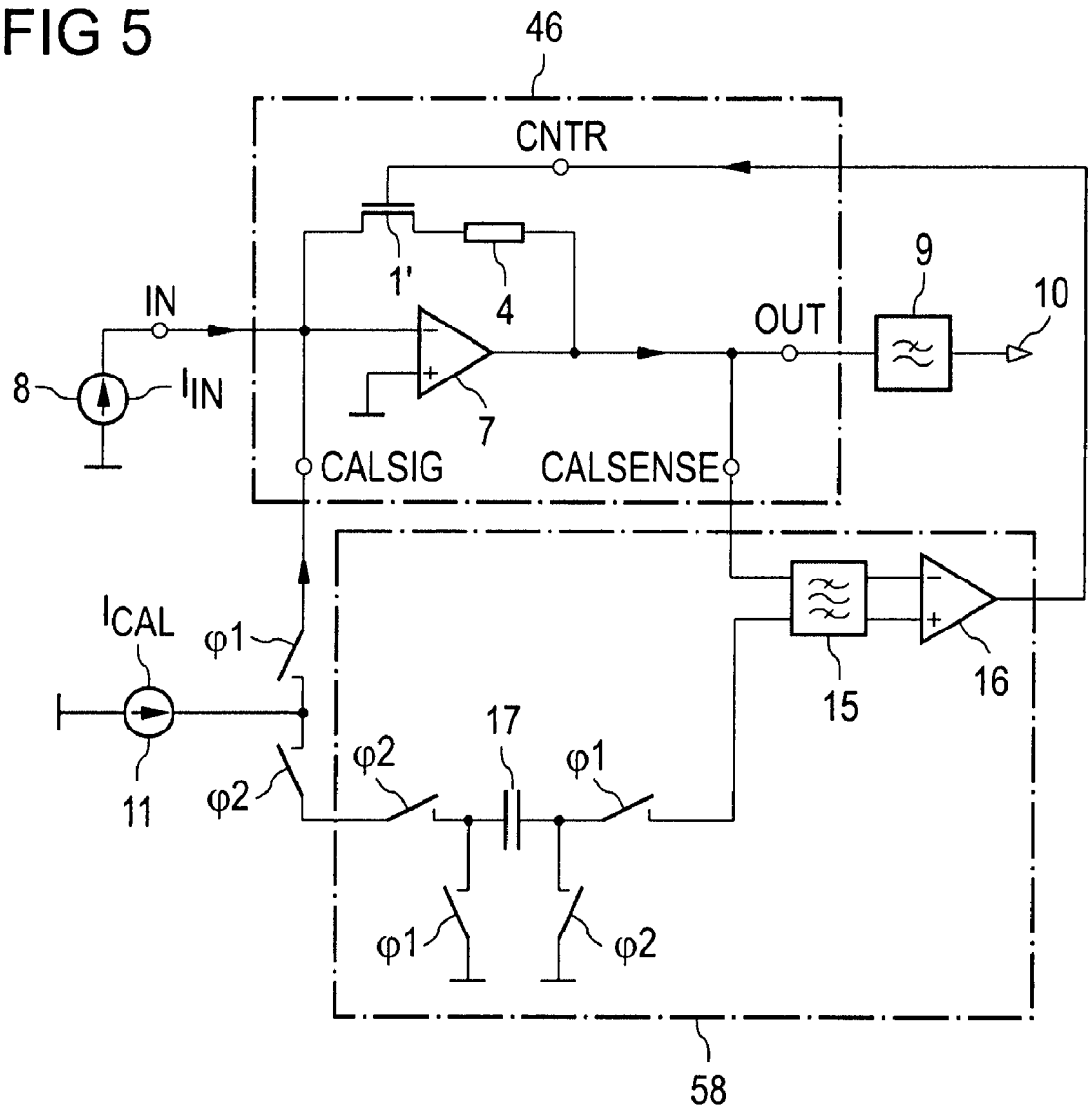
FIG. 5 shows another, exemplary development of the circuit from FIG. 2 with a chopping principle.

FIG. 5 shows a development of the circuit from FIG. 3, the circuits largely corresponding in terms of the components used and the advantageous interconnection thereof. Instead of the changeover switches 12, 6 in FIG. 3, single switches are provided in this case. The capacitance 5 has been replaced by a series path capacitance 17. This is produced with four switches, but as before a switched-capacitor reference resistance. Between the input IN and the output OUT, a useful signal path is connected as a first current path comprising the operational amplifier 7 with a return path 1', 4.

Figure 6:
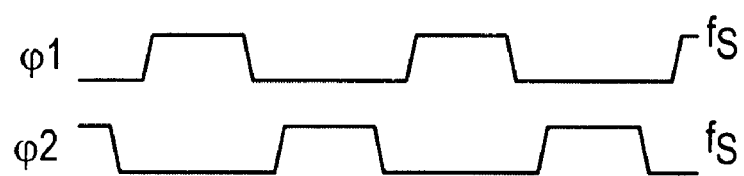
FIG. 6 shows an exemplary clock signal for actuating the switches from FIGS. 3 and 5.

FIG. 6 shows exemplary signals for actuating the switches φ1, φ2, as denoted therein. It can be seen that both control signals operate at the same chopping frequency $f_s$ and observe requisite non-overlap times. The non-overlap refers to the switches being controlled by φ1 on the one hand and φ2 on the other hand. It may be desirable to avoid having those differently controlled switches closed at the same time. Therefore, the respective control signals φ1 on the one hand and φ2 on the other hand are not HIGH at the same time. Instead, they are separated by a respective short period of a common LOW state. This is demonstrated by the example shown in FIG. 6.

Figure 7:
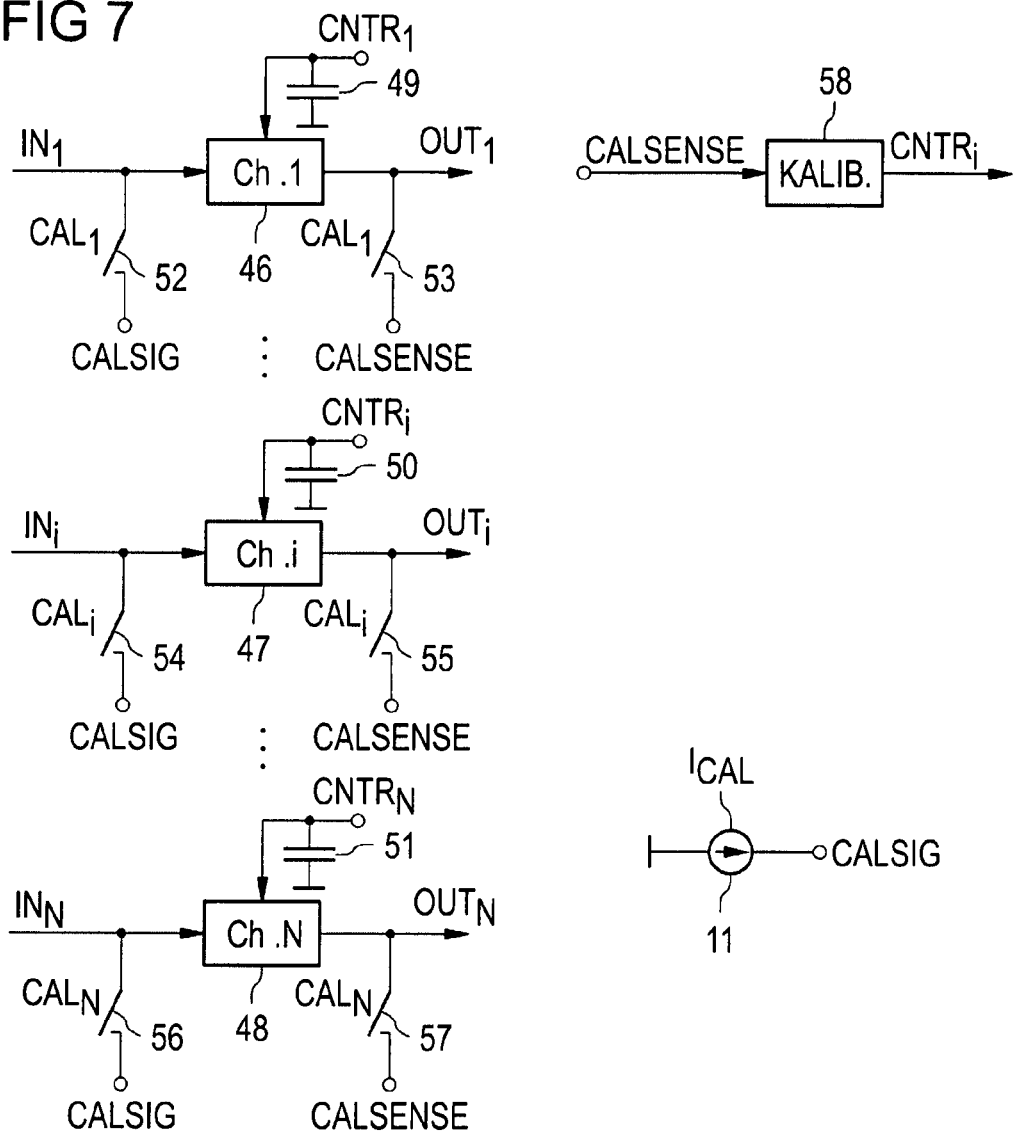
FIG. 7 shows an exemplary development of the circuit from FIG. 5 for a plurality of channels.

FIG. 7 shows an exemplary development of the circuit from FIG. 5 for a plurality of signal paths for processing a plurality of useful signals. These are calibrated on the basis of the features as explained by way of example with reference to FIG. 5. In this case, the calibration path is present only once. The individual signal paths are calibrated in succession in a time-division multiplex mode. In this case, a respective signal path is calibrated while the other signal paths are respectively used only for useful signal processing. Specifically, three signal paths 46, 47, 48 are provided by way of example which are set up to process a respective useful signal and which are formed between an input IN and an output OUT. The input and output IN, OUT have respective switches 52 to 57 connected to them. The input-side switches 52, 54, 56 are each used to supply a calibration signal CALSIG in a calibration mode for the respective useful signal path. The calibration signal CALSIG is provided by the current source 11. In the calibration mode for the respective useful signal path, the output-side switch 53, 55, 57 is used to output a sampling signal CALSENSE and to supply it to a calibration device 58, which may have the design shown in FIG. 5, for example. The calibration device 58 is used to provide a control signal CNTR for the respectively calibrated useful signal path 46, 47, 48 which is in turn taken as a basis for setting the controllable resistance 1'. For the purpose of storing the respective control signal CNTR, each control connection of the useful signal paths has a capacitor 49, 50, 51 connected to it which is grounded. It is thus possible for each channel 46, 47, 48 to be calibrated for a few clock periods. The resultant control signal CNTR is stored on the capacitor 49, 50, 51 and is used to set the resistance value of the controllable resistance 1'. Subsequently, the next signal path 47, 48, 46 is calibrated. The relatively small leakage currents in integrated capacitors and the relatively long time constants for temperature changes allow a signal path 46, 47, 48 to be operated for a relatively long period without simultaneous calibration. Accordingly, it is possible to attain a significant saving in terms of chip area and electrical power virtually without any drawbacks regarding accuracy, since only one calibration path is required for a plurality of useful signal paths. In addition, a single, high-precision calibration signal CALSIG suffices, which could not be provided at such precision if a separate calibration signal were required for each signal path. Since, as already explained in detail above, the calibration signal and the useful signal use different frequency bands it is also possible to use the channel which is currently being calibrated for processing the useful signal without interruption.

Figure 8:
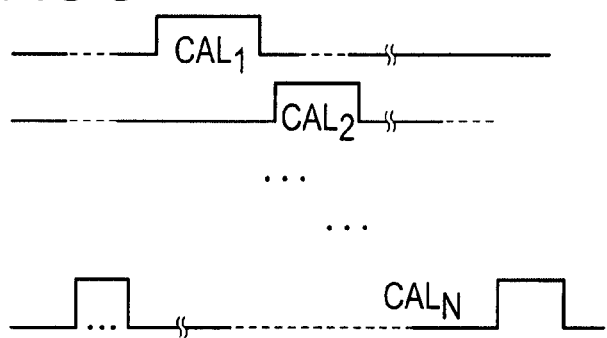
FIG. 8 shows exemplary clock signals for actuating the switches from FIG. 7.

FIG. 8 shows exemplary clock signals for actuating the switches in FIG. 7. These control signals CAL1, CAL2, . . . , CalN activate the respectively associated switches in FIG. 7 periodically in succession in order to attain the time-division multiplex mode. Hence, calibration based on the proposed principle is performed in a respective one of the useful signal paths 46, 47, 48 while there is no provision for the useful signal to be superimposed by a calibration signal in the respective remaining channels.

Figure 9:
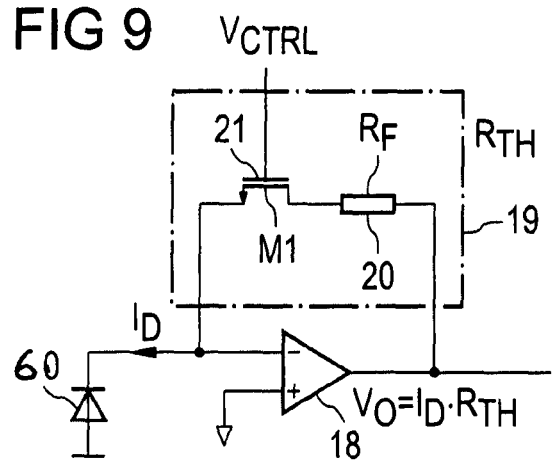
FIG. 9 shows an exemplary embodiment of the useful signal amplifier with a controllable feedback resistance.

FIG. 9 refers to an optical receiver. As such, the more general signal source is replaced by a photodiode providing the useful signal in response to an incoming optical signal. FIG. 9 shows an exemplary embodiment of the invention with a transimpedance amplifier 18 the output of which is connected to an inverting input of the transimpedance amplifier 18 via a series circuit 19. A reverse biased photodiode 60 is connected to the inverting input of the transimpedance amplifier 18. The return path comprises the series circuit 19 containing a further fixed-value resistance 20 and a further controllable resistance 21.

Figure 10:
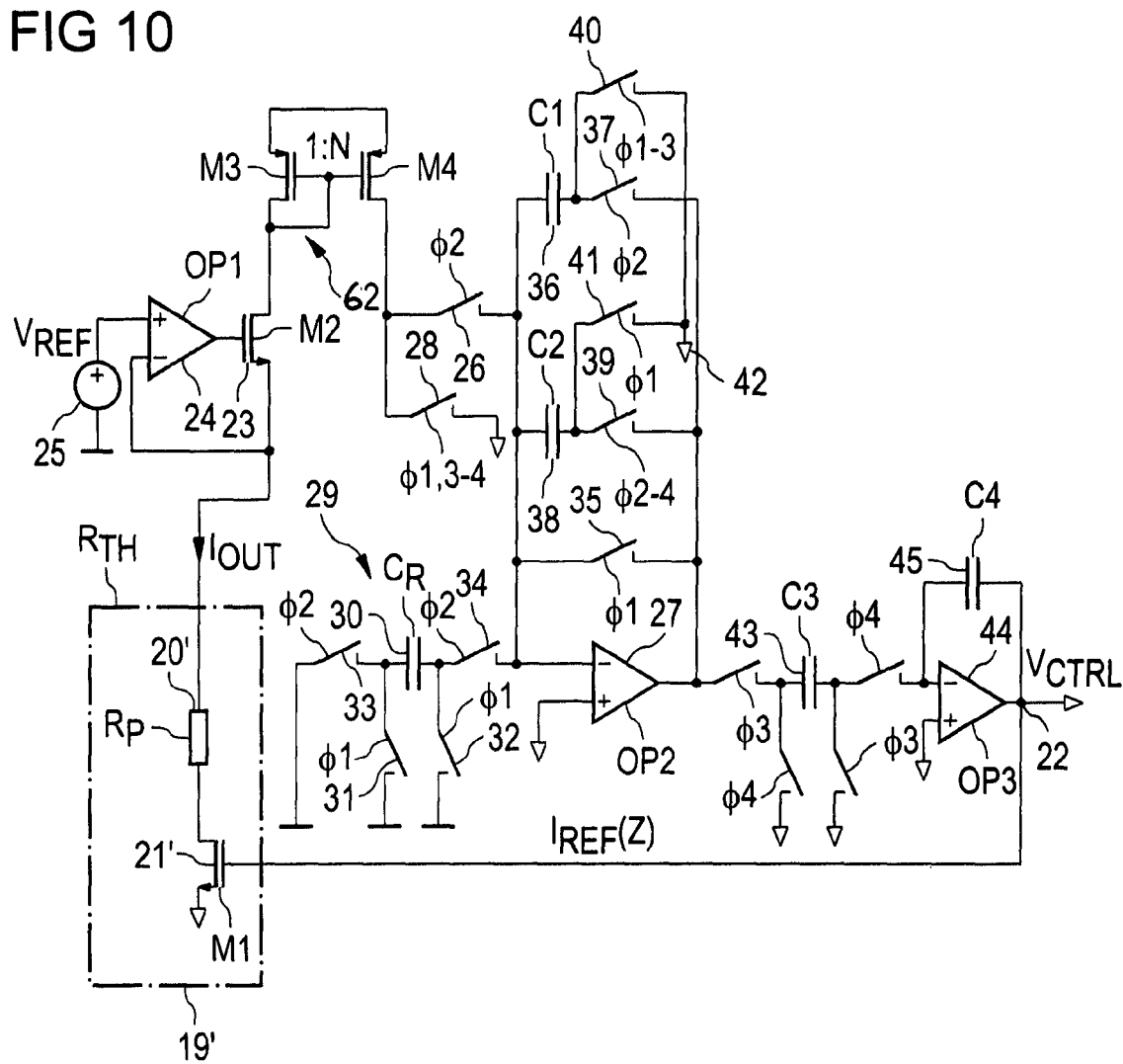
FIG. 10 shows an exemplary embodiment of a circuit based on the proposed principle for actuating the resistance from FIG. 9.

The further controllable resistance 21 comprises a metal oxide semiconductor, MOS, transistor with a control input and a controlled path. The control voltage for the controllable resistance 21 is provided by a circuit as shown in FIG. 10, as explained below. The optical receiver shown in FIG. 9 requires a very precise transimpedance which is independent of temperature, in particular. If the resistance of photodiode 60 is designed as a semiconductor resistance made of doped polycrystalline semiconductor material, such as polycrystalline silicon, as preferred, then it has a temperature drift of typically 600 ppm per Kelvin. The transimpedance amplifier 18 shown in FIG. 9 converts the photodiode current into an output voltage which can be processed further. The gain of such a circuit is defined by the feedback resistance 19. A high-precision gain is required for high-accuracy sensor applications, for example glucose measuring equipment for blood sugar content. Temperature compensation is therefore required in order to produce a resistance which is free of temperature drift. In particular, the temperature drift must be less than approximately 200 ppm per Kelvin.

The circuit explained below which is shown in FIG. 10 and is based on the present invention can be used to keep the resistance of the series circuit largely free of temperature drifts, and to do the same for the transimpedance of the amplifier.

FIG. 10 shows a circuit for producing a control voltage $V_{CTRL}$ at an output 22, said circuit being used to control the transistor 21 in FIG. 9 in temperature-compensating fashion. For this, the circuit in FIG. 10 comprises a copy of the series circuit 19 in FIG. 9, which is referred to as series circuit 19' (or a "dummy" resistor). This series circuit 19' comprises a fixed-value resistance 20' and a controllable resistance 21', in each case as a copy of the relevant components 20, 21 of the series circuit 19 in FIG. 9. The control input of the controllable resistance 21' is likewise connected to the output 22. An input (at the node between transistors M2 and M3) of a current mirror 62 is connected via the controlled path of a transistor 23 to a connection of the series circuit 19'. Series circuit 19' is also connected to a reference potential connection. Current mirror 62 includes transistors M3 and M4. The transistor 23 has a gate connection which is connected to the output of an amplifier 24. The non-inverting input of the amplifier 24 is connected to a reference voltage source 25, while the inverting input of the amplifier 24 is connected to the voltage node which connects the transistor 23 to the series circuit 19'. An output of the current mirror 62, which has a transformation ratio of 1:N, is connected to an inverting input of a comparator 27 via a switch 26 in a second clock phase φ2. In addition, the output of the current mirror 62 is coupled to a reference potential connection via a switch 28 in a first, third and fourth clock phase φ1, φ3, φ4. A switched-capacitor reference resistance 29 is likewise connected to the inverting input of the comparator 27. A respective connection of the capacitor 30 which the switched-capacitor reference resistance 29 comprises can be connected to reference potential by means of a respective switch 31, 32 in a first clock phase φ1. In addition, switches 33, 34 are provided which connect the capacitor 30 between the inverting input of the comparator 27 and a reference potential connection in a second clock phase φ2.

The comparator 27 is itself in the form of a switched-capacitor amplifier. For this, a return path comprises three parallel-connected paths. A first path between the output of the comparator 27 and its inverting input comprises a switch 35 which can be activated in a first clock phase φ1. A second path comprises a capacitor 36 which is connected in series with a switch 37 for operation in a clock phase φ2. A second capacitor 38 likewise forms a series circuit with a switch 39 in a third return path. The switch 39 is closed in the second to fourth clock phases φ2, φ3, φ4. Further switches 40, 41 are used to connect a node between the first and second capacitors 36, 38 and the associated switch 37, 39 to a reference potential connection 42.

In this case, the further switch 40, which is associated with the first capacitor 36, is closed in the first and third clock phases φ1, φ3. The further switch 41, which is associated with the second capacitor 38, is closed in the first clock phase φ1. The output of the comparator 27, which implements an error amplifier, is connected to the output 22 via a loop filter. The loop filter comprises a switched capacitor 43 which is connected as switched capacitor between the output of the amplifier 27 and an inverting input of a further amplifier 44. Four switches on the switched capacitor 43 are used to charge it in the third clock phase φ3 with the output signal from the amplifier 27 and to discharge it in the fourth clock phase φ4 to the input of the further amplifier 44. The further amplifier 44 has a capacitance 45 in the return path between its output, which is connected to the output 22, and its inverting input. The non-inverting input of the amplifier 44 is connected to ground potential. The capacitors 43, 45 are used to stabilize the control loop. The capacitors 36, 38 in the return path of the error amplifier define the residual error.

In line with FIG. 10, a bandgap voltage source 25 and a reference resistance 29 are used as reference components. With the circuit implementation used, this serves to provide a resistance 19 having much lower temperature dependency. The circuit shown in FIG. 10 produces a temperature-dependent control voltage using a control loop in the output 22, said control voltage being produced using a reference generator. The MOS transistor 21 or 21' adds an additional resistance to the feedback resistance 19, 19', which compensates for a temperature drift. A model of this series circuit 19' in the control loop shown in FIG. 10 is used to produce an output current $I_{out}$. A minor of the output current is compared with an equivalent reference current which is produced by a switched capacitor 29. The two currents are compared using the error amplifier 27, which produces the control voltage downstream of a filter 43, 44, 45. This control voltage in turn varies the resistance value of the resistance 21' until the output current $I_{out}$ and the reference current produced by the switched capacitor 29 are the same. The loop filter 43 to 45 stabilizes the control loop and is itself designed using switched-capacitor technology. The remaining temperature drift is accordingly stipulated by the accuracy of the reference source 25, the temperature drift in the reference capacitor 30, the temperature drift in the reference clock source which actuates the switches in FIG. 10 and a temperature drift in the current mirror 62. The bandgap voltage generator 25 has a temperature coefficient of less than 15 ppm per Kelvin. To actuate the switches, a crystal reference is used which has excellent temperature drifts of significantly less than 1 ppm per Kelvin. The main contribution is thus made by the reference capacitor 30, which has a typical temperature drift in the example of 43 ppm per Kelvin. Overall, however, even with a worst-case appraisal, the total temperature drift for the arrangement remains significantly below 100 ppm per Kelvin, which is a significant improvement. The use of the copy of the series resistance circuit 19' in the series circuit 19 in FIG. 9 avoids any errors which might arise as a result of charge injection by the switched-capacitor circuits into the useful signal path.

Figure 11:
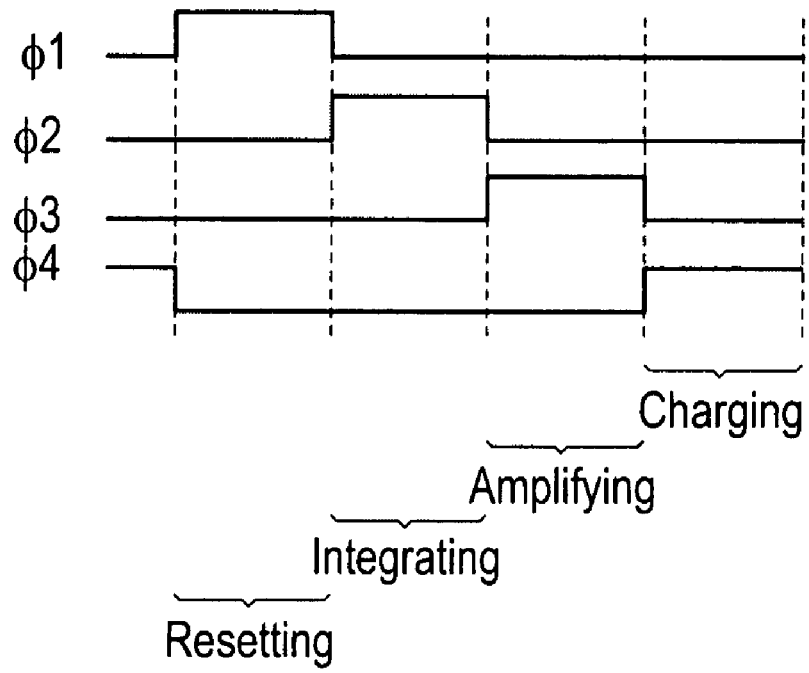
FIG. 11 shows exemplary signals for actuating the switches from FIG. 10 in four clock phases.

FIG. 11 shows the time profile for the control signals for the switches in FIG. 10 in the four provided clock phases φ1 to φ4 by way of example. In this case, the label for the respective switches in FIG. 10 means that this switch is operated, that is to say closed, in the respective clock phase. In this context, the first clock phase φ1 corresponds to resetting, the second to integration, the third to amplification and the fourth to charging.

In detail, the circuit's capacitors 30, 36, 38 in the reference resistance and in the return path of the error amplifier are reset in the first clock phase φ1. The output of the operational amplifier 27 is set to the analog ground voltage VAGND. At the output of the amplifier 44, the control voltage remains unchanged.

In the second clock phase φ2, the capacitors 36, 38 in the return path of the error amplifier are connected in parallel. At the start of this clock phase, the reference resistance with the capacitor 30 is charged to the analog reference voltage VAGND, and this charge is transferred to the two capacitors 36, 38. During the second clock phase, the capacitors 36, 38 are discharged by the output current $I_{OUT}$ in an integration cycle. At the end of the second clock phase, the charge difference between the reference voltage VAGND multiplied by the reference capacitor 30 and the output current $I_{out}$ multiplied by the clock period of the second phase φ2 is stored on the capacitors 36, 38.

In the third clock phase φ3, the charge difference described is amplified by transferring the charge from the capacitor 36 to the capacitor 38. For this, capacitor 36 is shorted to the analog reference voltage VAGND. The output of the error amplifier 27 is sampled to the switched capacitor 43.

In the fourth and final clock phase φ4, the charge is transferred from the capacitor 43 to the capacitor 45 of the loop filter and controls the gate of the transistor 21' and of the transistor 21 in FIGS. 9 and 10 to a value. This value simultaneously sets the new resistance value which the resistance 21' and hence the series circuit 19' have for the subsequent cycle.

Figure 12:
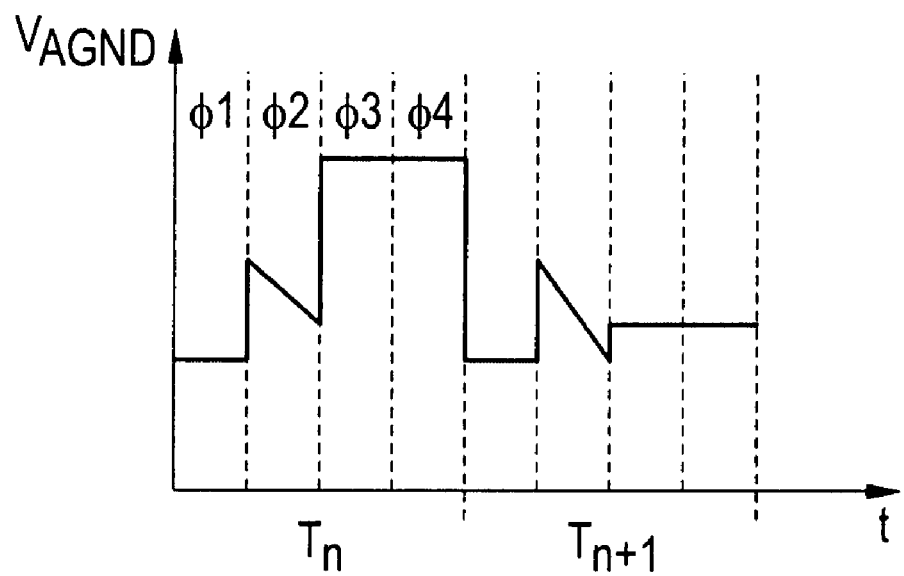
FIG. 12 shows the exemplary signal profile for a comparison signal as shown in FIG. 10.

FIG. 12 shows the exemplary profile of the reference signal as error signal VAGND, namely the charge difference. As can be seen from FIG. 12, the charge difference in the subsequent clock cycle $T_{n+1}$ is smaller on account of the matching of the gate voltage Vctrl in the preceding cycle $T_n$.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A temperature compensation arrangement for a resistance comprising:
   a resistance having a controllable resistance value;
   a reference resistance which forms a switched capacitor;
   a comparator having an input side which is coupled to the resistance having the controllable resistance value and to the reference resistance and having an output for outputting an error signal;
   a control input on the resistance having the controllable resistance value which is coupled to the output of the comparator for controlling the resistance value; and
   a common current source which is switchably connected to two current paths;
   wherein a first current path of the two current paths comprises the resistance having the controllable resistance and a second current path of the two current paths comprises the reference resistance which forms the switched capacitor.

2. The arrangement as claimed in claim 1, wherein the resistance having the controllable resistance value forms a series circuit comprising a fixed-value resistance and the resistance having the controllable resistance value.

3. The arrangement as claimed in claim 1, wherein the reference resistance forms a switched capacitor comprising a capacitance and at least one switch for periodic changeover at a reference clock frequency.

4. The arrangement as claimed in claim 1, further comprising:
   a reference clock generator which is coupled to the reference resistance which forms the switched capacitor.

5. The arrangement as claimed in claim 1, wherein the resistance having the controllable resistance value is arranged in a return path of an amplifier.

6. The arrangement as claimed in claim 3, further comprising:
wherein the resistance having the controllable resistance value is arranged in a useful signal path, set up for signal processing for a useful signal in a useful frequency range, and the useful frequency range is different than the frequency of the reference clock frequency.

7. The arrangement as claimed in claim 6, wherein the useful signal path comprises a transimpedance amplifier, the resistance having the controllable resistance value is in a feedback path of the transimpedance amplifier, and the comparator has a first input connected to an output of the transimpedance amplifier and has a second input connected to the second current path.

8. The arrangement as claimed in claim 6, further comprising:
a plurality of useful signal paths which are coupled to a common second current path via switches for calibration in a time-division multiplex mode.

9. The arrangement as claimed in claim 1, wherein the arrangement comprises integrated circuitry.

10. A method for temperature compensation for a resistance, comprising the steps of
providing a controllable resistance;
providing and actuating a reference resistance as a switched capacitor;
comparing a resistance value of the controllable resistance with the resistance value of the reference resistance;
controlling resistance value of the controllable resistance based on a comparison result from the, comparison of the resistance value of the controllable resistance with the resistance value of the reference resistance; and
alternately supplying a first current path and a second current path with a common current, the first current path comprising the controllable resistance and the second current path comprising the reference resistance.

11. The method as claimed in claim 10, further comprising:
providing the resistance value of the controllable resistance as a sum of a fixed-value resistance value and a controllable resistance value.

12. The method as claimed in claim 10, further comprising:
providing the reference resistance through periodic changeover of a switchable capacitance under control of a reference clock.

13. The method as claimed in claim 10, further comprising:
providing the controllable resistance in a return path of an amplifier.

14. The method as claimed in claim 12, further comprising:
processing a useful signal in a useful frequency range using the controllable resistance, and
controlling the switchable capacitance using the reference clock, the frequency of which is different than the useful frequency range.

15. The method as claimed in claim 14, further comprising:
amplifying the useful signal using a transimpedance amplifier based on the resistance value of the controllable resistance, and
comparing the amplified useful signal with a signal derived from the reference resistance.

16. The method as claimed in claim 14, further comprising:
alternately calibrating a plurality of useful signal paths in a time-division multiplex mode using a common calibration signal based on a common reference resistance.

* * * * *